(12) United States Patent
Kaga

(10) Patent No.: US 10,095,651 B2
(45) Date of Patent: Oct. 9, 2018

(54) SEMICONDUCTOR STORAGE DEVICE

(71) Applicant: Toshiba Memory Corporation, Minato-ku (JP)

(72) Inventor: Hiroyuki Kaga, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 568 days.

(21) Appl. No.: 14/844,089

(22) Filed: Sep. 3, 2015

(65) Prior Publication Data
US 2016/0267045 A1   Sep. 15, 2016

Related U.S. Application Data

(60) Provisional application No. 62/130,830, filed on Mar. 10, 2015.

(51) Int. Cl.
| | |
|---|---|
| *G06F 13/00* | (2006.01) |
| *G06F 13/42* | (2006.01) |
| *G06F 13/16* | (2006.01) |
| *G06F 13/40* | (2006.01) |
| *G11C 7/10* | (2006.01) |
| *G11C 7/22* | (2006.01) |
| *G11C 16/04* | (2006.01) |
| *G11C 16/32* | (2006.01) |

(52) U.S. Cl.
CPC ...... *G06F 13/4282* (2013.01); *G06F 13/1642* (2013.01); *G06F 13/1673* (2013.01); *G06F 13/4077* (2013.01); *G11C 7/1039* (2013.01); *G11C 7/1048* (2013.01); *G11C 7/227* (2013.01); *G11C 16/0483* (2013.01); *G11C 16/32* (2013.01)

(58) Field of Classification Search
CPC .......................... G06F 13/4077; G11C 7/1039
See application file for complete search history.

(56) References Cited

U.S. PATENT DOCUMENTS

| | | | |
|---|---|---|---|
| 2005/0038952 A1* | 2/2005 | Chang | G11C 7/1039 711/4 |
| 2014/0063964 A1* | 3/2014 | Futatsuyama | G11C 7/06 365/185.17 |

* cited by examiner

*Primary Examiner* — Zachary K Huson
(74) *Attorney, Agent, or Firm* — Oblon, McClelland, Maier & Neustadt, L.L.P.

(57) ABSTRACT

A semiconductor storage device according to one embodiment includes a memory cell. A first latch is selectively coupled to the memory cell. A first bus coupled to the first latch and a second latch. A first charger charges the first bus. A second bus transmits a signal of the same value both when first data is output and when second data is output from the first or second latch A second charger raises a voltage of the second bus from a first value to a second value. A controller whose input is coupled to the second bus controls the first charger to stop charging of the first bus based on the voltage of the second bus having reached the second value.

14 Claims, 11 Drawing Sheets

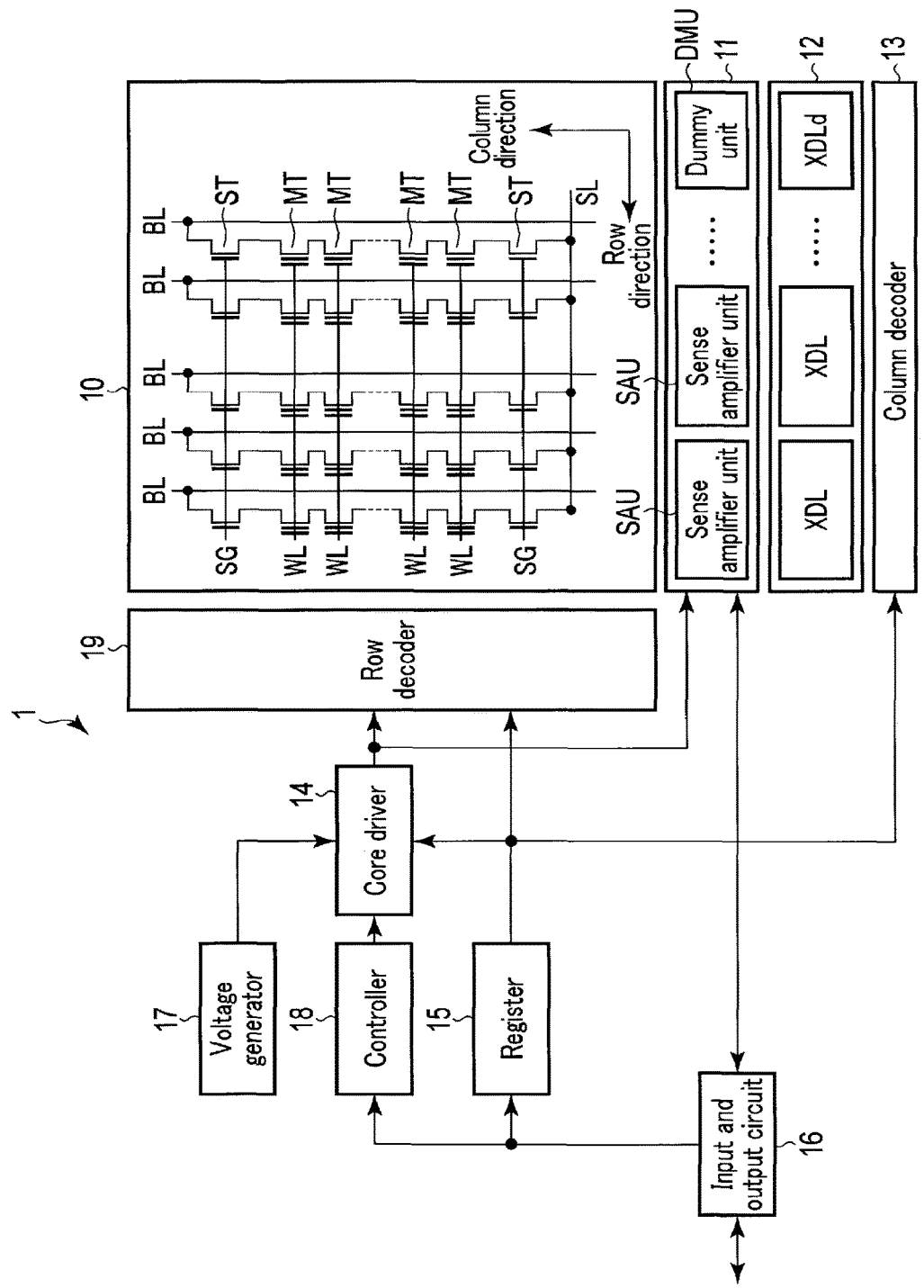
F I G. 1

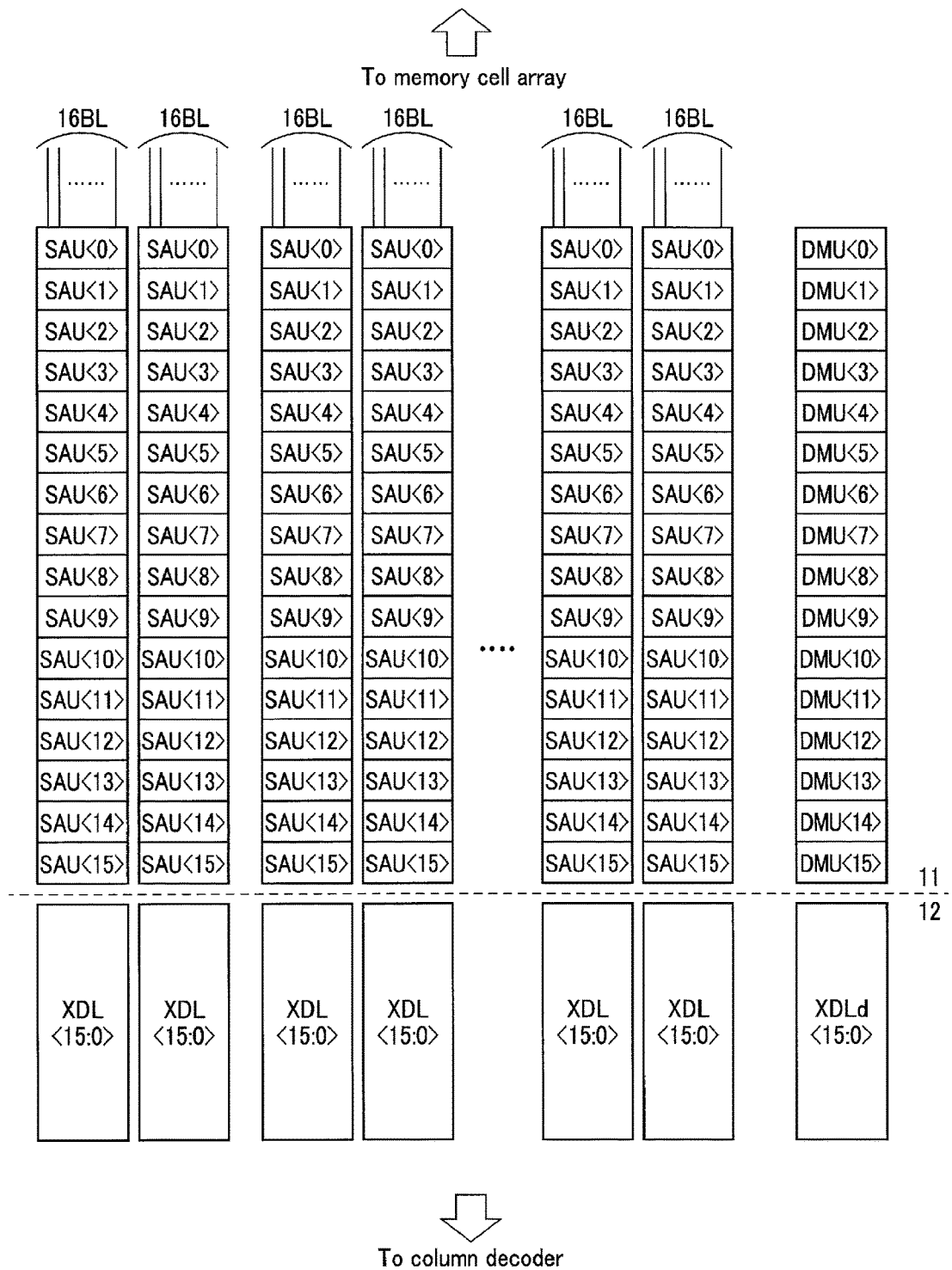
F I G. 2

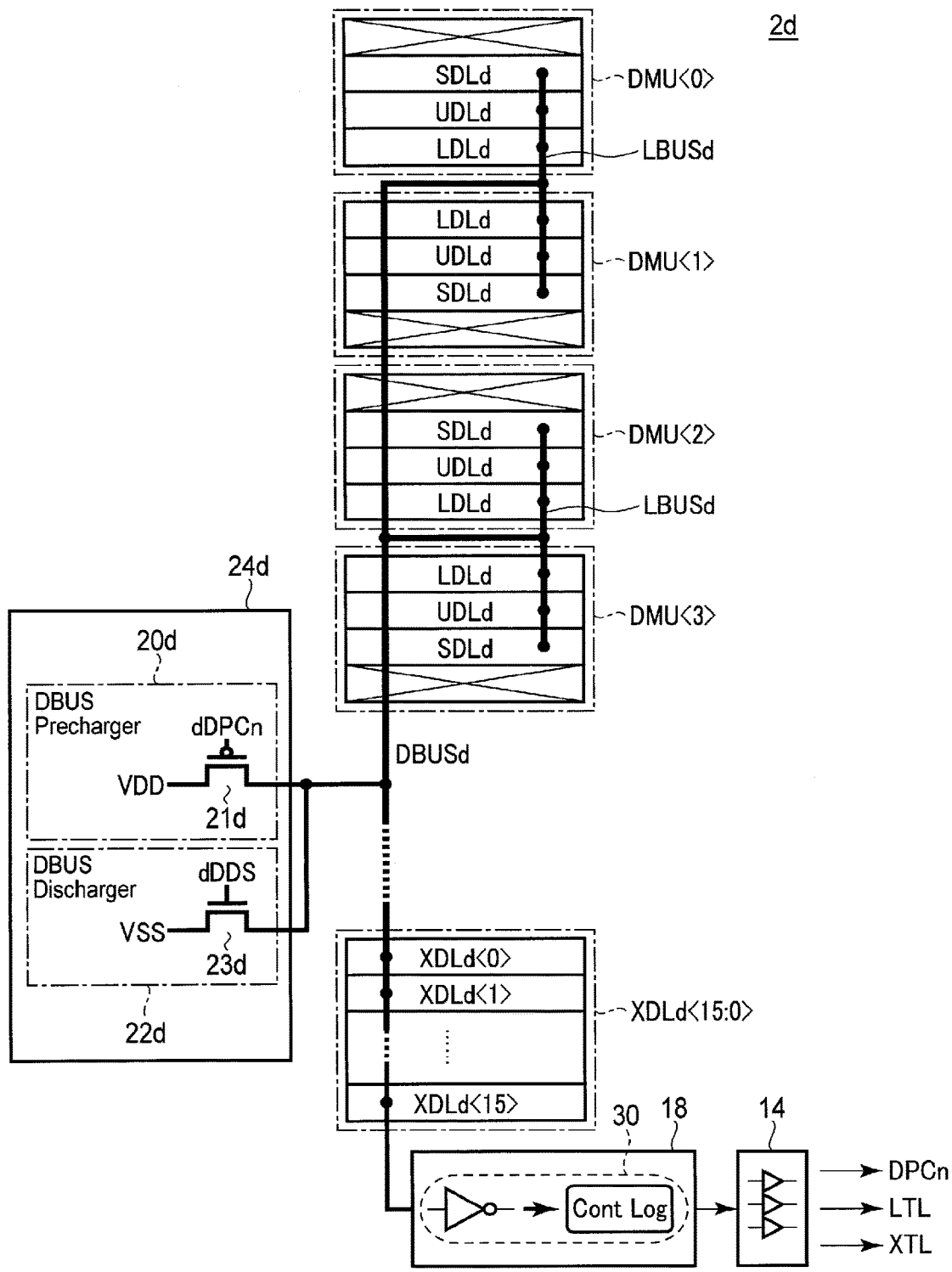
F I G. 4

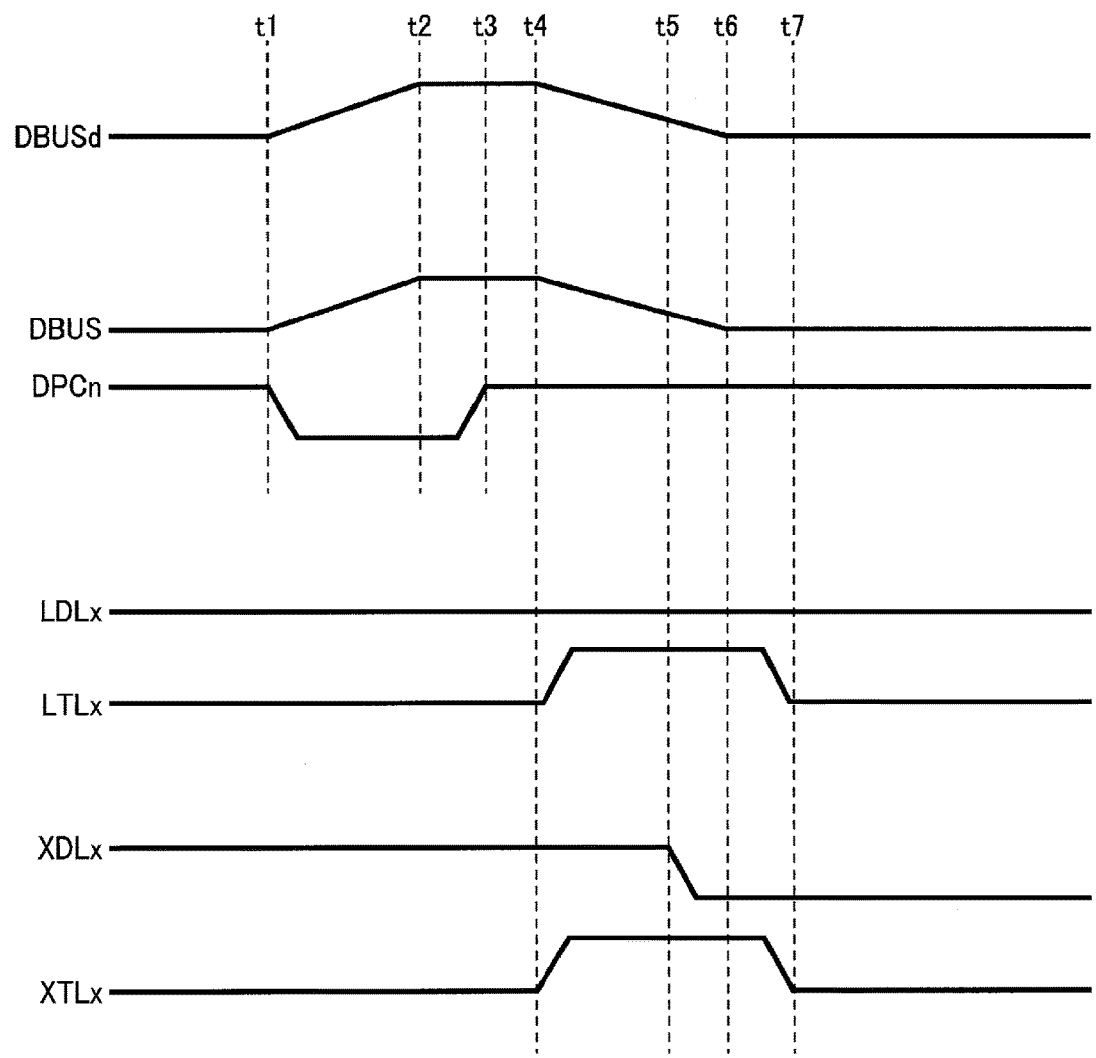
F I G. 7

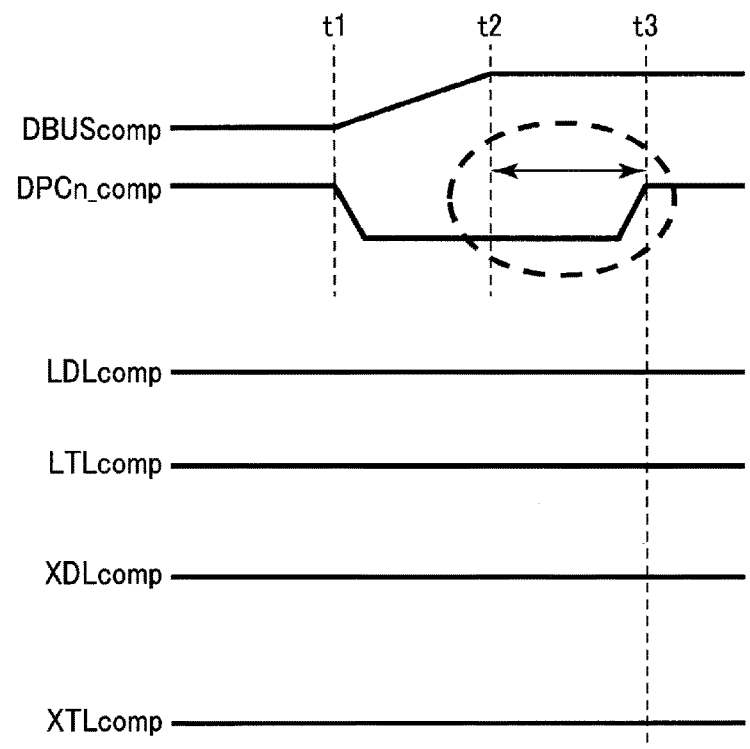
F I G. 10
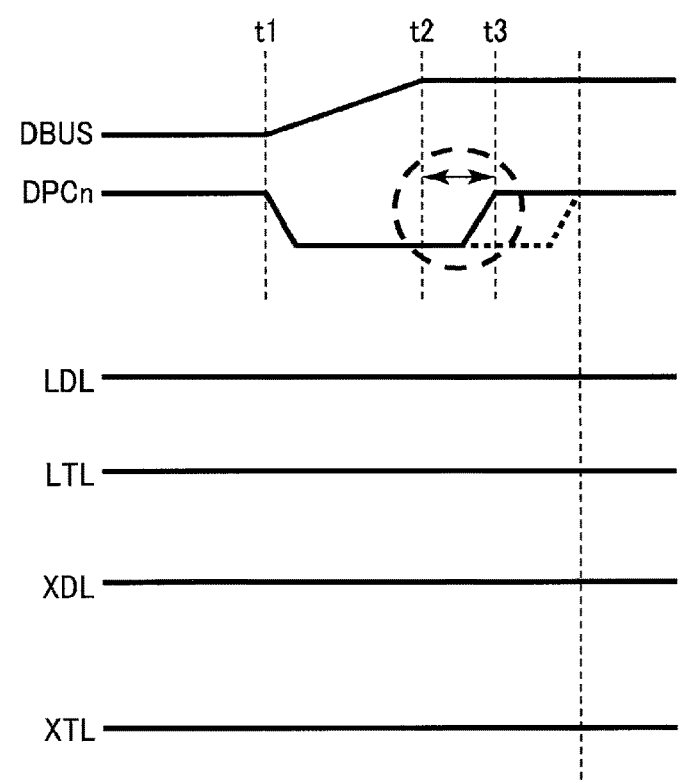
F I G. 11

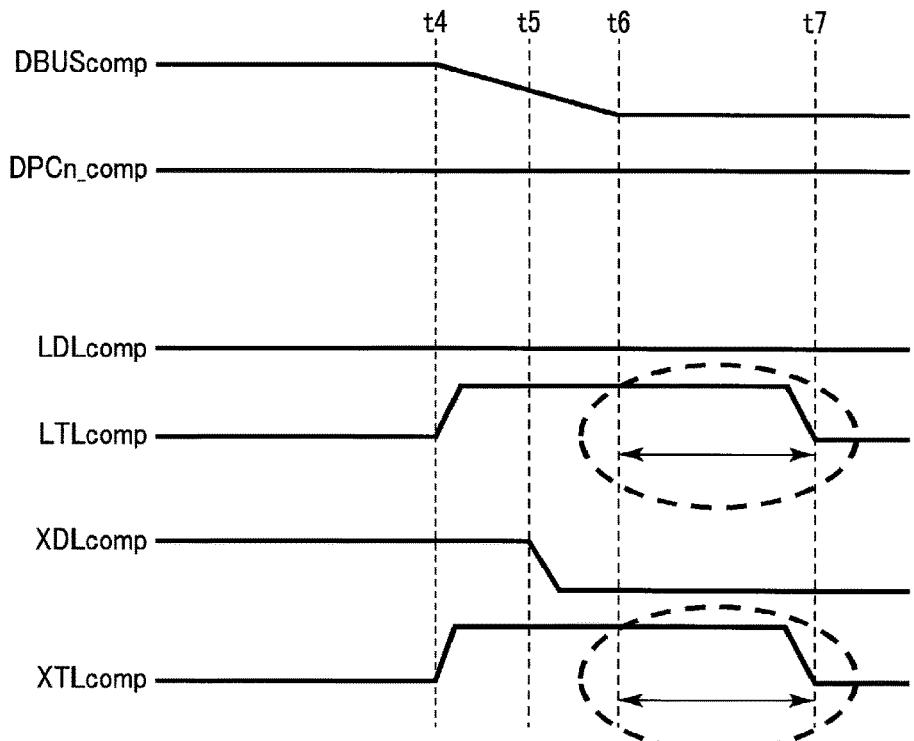
F I G. 12
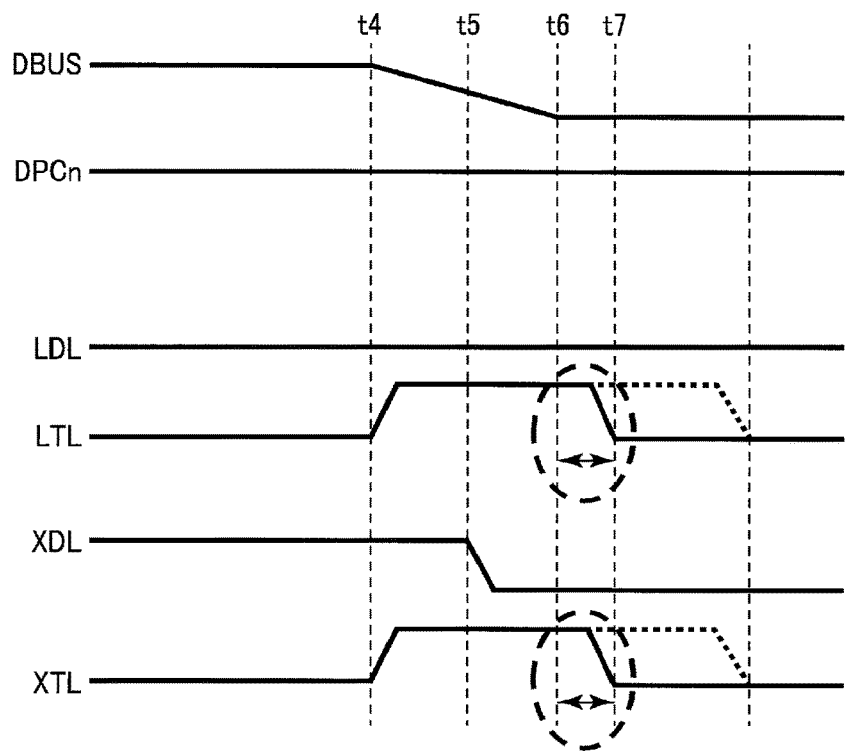
F I G. 13

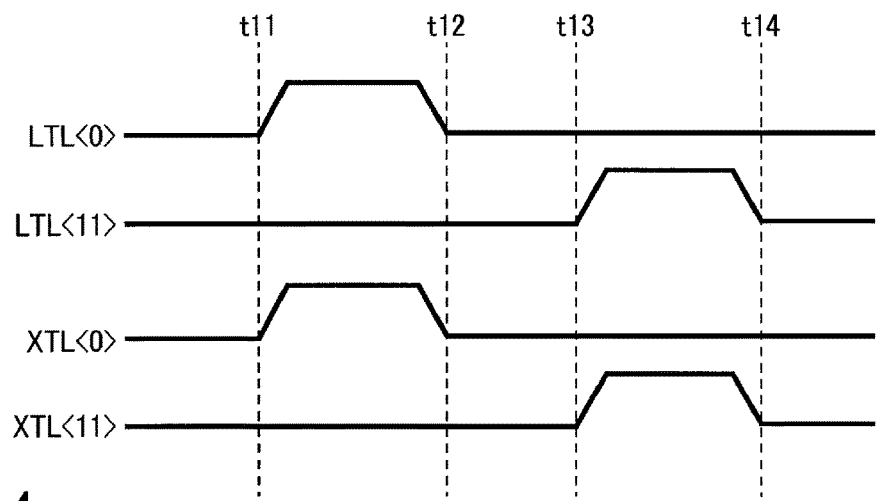
F I G. 14
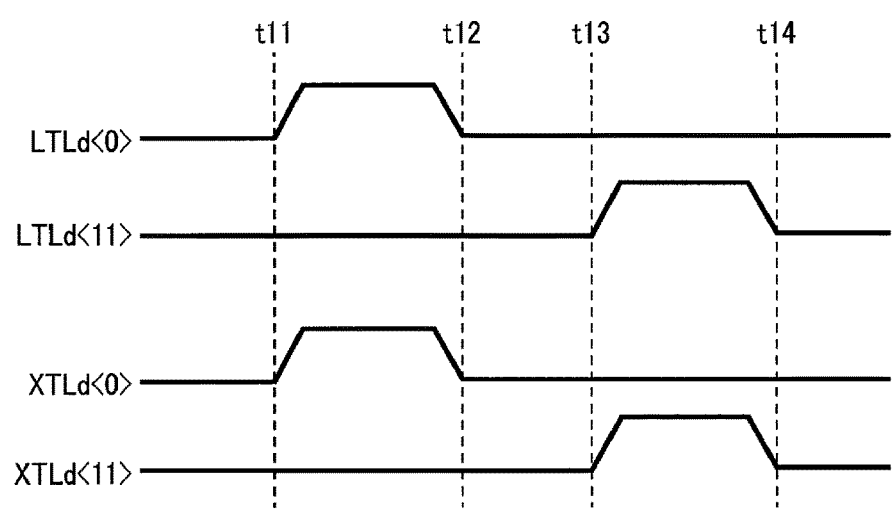
F I G. 15
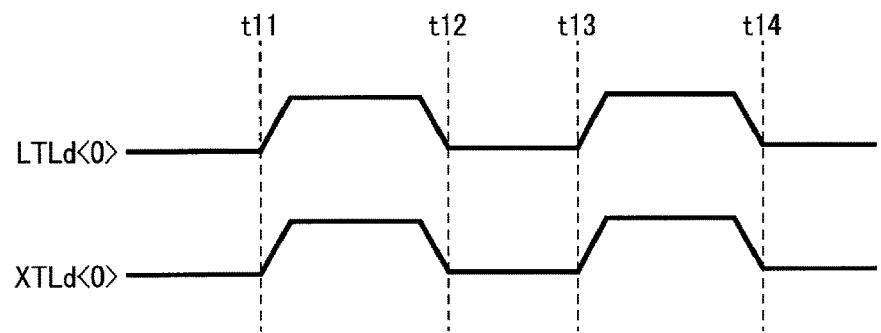
F I G. 16

SEMICONDUCTOR STORAGE DEVICE

CROSS-REFERENCE TO RELATED APPLICATIONS

This application claims the benefit of U.S. Provisional Application No. 62/130,830, filed Mar. 10, 2015, the entire contents of which are incorporated herein by reference.

FIELD

Embodiments relate generally to a semiconductor storage device.

BACKGROUND

As a semiconductor storage device, for example, a NAND flash memory is known.

BRIEF DESCRIPTION OF THE DRAWINGS

FIG. 1 illustrates an example of functional blocks of a semiconductor storage device according to an embodiment;

FIG. 2 illustrates an example of functional blocks of a sense amplifier module and a page buffer which the semiconductor storage device according to the embodiment includes;

FIG. 4 illustrates an example of functional blocks of partial areas of the sense amplifier module and page buffer which the semiconductor storage device according to the embodiment includes;

FIG. 7 illustrates an example of a timing chart of each of signals in data transfer of the semiconductor storage device according to the embodiment;

FIG. 10 illustrates an example of a timing chart of each of signals at a time of the start of data transfer of a semiconductor storage device according to a comparative example;

FIG. 11 illustrates an example of a timing chart of each of signals at a time of the start of data transfer of the semiconductor storage device according to the embodiment.

FIG. 12 illustrates an example of a timing chart of each of signals at a time of the end of data transfer of the semiconductor storage device according to the comparative example;

FIG. 13 illustrates an example of a timing chart of each of signals at a time of the end of data transfer of the semiconductor storage device according to the embodiment;

FIG. 14 illustrates an example of a timing chart of each of signals in data transfer of data latches of a semiconductor storage device according to a modification of the embodiment;

FIG. 15 illustrates an example of a timing chart of each of signals in data transfer of dummy latches of the semiconductor storage device according to the modification of the embodiment;

FIG. 16 illustrates another example of a timing chart of each of signals in data transfer of dummy latches of the semiconductor storage device according to the modification of the embodiment;

DETAILED DESCRIPTION

Figure 3:
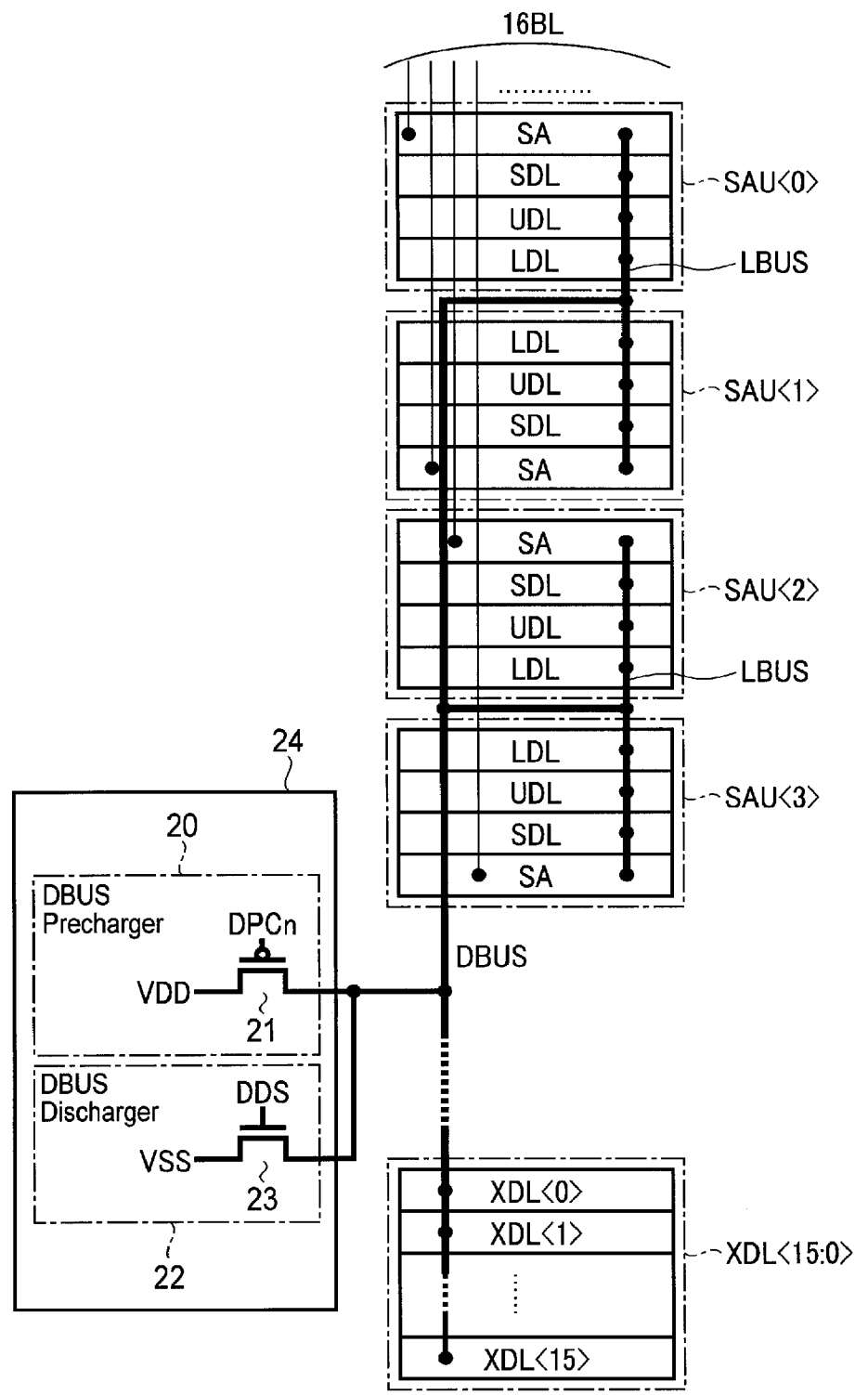
FIG. 3 illustrates an example of functional blocks of partial areas of the sense amplifier module and page buffer which the semiconductor storage device according to the embodiment includes.

A semiconductor storage device, such as a NAND flash memory, includes, for example, a plurality of data latches. Each data latch temporarily stores data relating to a memory cell. Such data may be transferred from one data latch to another data latch.

The time that is needed for data transfer may vary among a plurality of semiconductor storage devices, or within one semiconductor storage device. Thus, the transfer time is set, for example, in accordance with a longest time of such variance. However, in a case in which the time required for actual transfer is relatively short, a useless wait time occurs.

A semiconductor storage device according to one embodiment includes a memory cell. A first latch is selectively coupled to the memory cell. A first bus coupled to the first latch and a second latch. A first charger charges the first bus. A second bus transmits a signal of the same value both when first data is output and when second data is output from the first or second latch A second charger raises a voltage of the second bus from a first value to a second value. A controller whose input is coupled to the second bus controls the first charger to stop charging of the first bus based on the voltage of the second bus having reached the second value.

Embodiments will be described hereinafter with reference to the accompanying drawings. In the drawings, the same parts are denoted by like reference numerals.

<Embodiment>

A semiconductor storage device according to the embodiment will be described below. The semiconductor storage device according to the embodiment is, for example, a NAND flash memory.

(1) Configuration Example of Semiconductor Storage Device.

Referring to FIG. 1, a description is given of a configuration example of a NAND flash memory 1 as the semiconductor storage device according to the embodiment. FIG. 1 illustrates an example of functional blocks of the NAND flash memory 1.

As illustrated in FIG. 1, the NAND flash memory 1 includes a memory cell array 10, a row decoder 19, a sense amplifier module 11, a page buffer 12, a column decoder 13, a core driver 14, a register 15, an input/output circuit 16, a voltage generation circuit (generator) 17, and a control circuit (controller) 18. The NAND flash memory 1 includes at least one set of the memory cell array 10, sense amplifier module 11 and page buffer 12. The NAND flash memory 1 may include a plurality of such sets.

The memory cell array 10 includes bit lines BL, source lines SL, and word lines WL. The bit lines BL and source lines SL extend in a column direction, and the word lines WL extend in a row direction. NAND strings, which are arranged in the row direction, are connected between respective bit lines BL and the source line SL. Each NAND string includes series-connected memory cell transistors MT, and a pair of select transistors ST which are connected in series to both ends of these memory cell transistors MT. The NAND strings are connected to the bit lines BL and the source line SL via the select transistors ST at the both ends. Each word line WL is connected to the gates of the memory cell transistors MT which are arranged in the row direction. A select gate line SG is connected to the gates of the select transistors ST which are arranged in the row direction. In the NAND flash memory 1, the memory cell transistors MT function as memory cells.

A memory cell transistor MT includes, for example, a multilayer structure of a control gate electrode and a floating gate electrode. In this multilayer structure, an electric charge is injected in the floating gate electrode. The threshold of the memory cell transistor MT varies by the injected charge amount, and thereby the memory cell transistor MT stores single-level data or multi-level data. The memory cell transistor MT may include a MONOS (Metal-Oxide-Nitride-Oxide-Silicon) structure in place of the above-described multilayer structure. In the MONOS structure, electrons are trapped in the nitride film.

The row decoder 19 selects one of the word lines at a time of write and read of data. In addition, the row decoder 19 applies necessary voltages to the selected word line WL and non-selected word lines WL.

The sense amplifier module 11 includes sense amplifier units SAU and a dummy unit DMU. The sense amplifier units SAU are provided in association with the bit lines BL. The dummy unit DMU does not correspond to any bit line BL and, for example, a smaller number of dummy units DMU than the number of sense amplifier units SALT are provided. During data read, the sense amplifier module 11 executes sense of data which was read out to the bit lines BL. During data write, the sense amplifier module 11 executes transfer of write data to the bit lines BL.

The page buffer 12 includes data latches XDL and a dummy latch XDLd. For example, the same number of data latches XDL as the number of the sense amplifier units SAU are provided. For example, the same number of dummy latches XDLd as the number of dummy units DMU are provided. The page buffer 12 temporarily stores read data and write data in a data unit called "page".

The column decoder 13 selects one of the sense amplifier units SAU in transfer of write data and read data.

The voltage generator 17 generates voltages which are necessary for data write, data read, data transfer which is involved in these operations, and data erase, for example, in response to an instruction of the controller 18. The voltage generator 17 supplies generated voltages to the core driver 14.

For example, responding to an instruction of the controller 18, the core driver 14 supplies necessary voltages, among the voltages supplied from the voltage generator 17, to the row decoder 19, sense amplifier module 11 and page buffer 12. The voltages supplied from the core driver 14 are transferred to the word lines WL by the row decoder 19, and are applied to the bit lines BL by the sense amplifier module 11. The voltage supplied from the core driver 14 is also used for data transfer by the page buffer 12.

The input/output circuit 16 controls input/output of signals from/to a controller or a host device, which accesses the NAND flash memory 1.

The register 15 stores commands, addresses, etc. which are received from the memory controller or host device. In addition, the register 15 transfers, for example, row addresses to the row decoder 19, and column addresses to the column decoder 13.

The controller 18 controls the operation of the entirety of the NAND flash memory 1 in accordance with commands received from the memory controller or host device. Various signals in the description below are generated, for example, by the controller 18.

(2) Configuration Example of Sense Amplifier Module and Page Buffer

Referring to FIG. 2 to FIG. 5, a description is given of a configuration example of the sense amplifier module 11 and page buffer 12 of the NAND flash memory 1.

[Outline of Configuration]

FIG. 2 illustrates an example of functional blocks of the sense amplifier module 11 and page buffer 12.

As illustrated in FIG. 2, the sense amplifier module 11 includes sense amplifier units SAU and dummy units DMU. The page buffer 12 includes data latches XDL and dummy latches XDLd. The numbers of these components SAU, DMU, XDL and XDLd, which will be described below, are merely examples, and are not limited to these examples.

A sense amplifier unit SAU is provided in association with each bit line BL, and senses data which was read out to the associated bit line BL. In addition, a sense amplifier unit SAU transfers write data to the associated bit line BL. For example, a set of sixteen sense amplifier units SAU is arranged in one column along the bit lines BL (sense amplifier units SAU0 to SAU15).

A data latch XDL is provided in association with each bit line BL, and temporarily stores data relating to the associated bit line BL. The data latches XDL are used for input/output of data from/to the sense amplifier units SAU, and enable a cache operation of the NAND flash memory 1. For example, a set of sixteen data latches XDL is arranged in one column such that the set of 16 data latches XDL is continuous on a column with the sixteen sense amplifier units SAU that are arranged in one column (data latches XDL0 to XDL15).

A dummy unit DMU includes a configuration corresponding to a sense amplifier unit SAU. Specifically, for example, a set of sixteen dummy units DMU is arranged near the sense amplifier units SAU, in juxtaposition with the column of the sense amplifier units SAU (dummy units DMU0 to DMU15). However, the dummy units DMU are not associated with the bit lines BL, and handle pseudo-data.

A dummy latch XDLd includes a configuration corresponding to a data latch XDL. Specifically, for example, a set of sixteen dummy latches XDLd is arranged near the data latches XDL, in juxtaposition with the column of the data latches XDL (dummy latches XDLd0 to XDLd15). However, the dummy latches XDLd are not associated with the bit lines BL, and temporarily store pseudo-data.

For example, one column of dummy units DMU and dummy latches XDLd is provided for a plurality of columns of sense amplifier units SAU and data latches XDL.

[Data Processing Circuit]

Referring to FIG. 3, a description is given of a more detailed configuration example of the sense amplifier units SAU and data laches XDL. FIG. 3 illustrates a state in which the sense amplifier units SAU and data laches XDL are arranged in one column.

As illustrated in FIG. 3, each of the sense amplifier units SAU includes a sense amplifier SA and, for example, three data latches SDL, UDL and LDL. In a sense amplifier unit SAU, it is the sense amplifier SA that relates to the control of potential of the bit line BL. Specifically, as described above, the sense amplifier SA senses the bit line BL, or applies a voltage to the bit line BL. The data latch SDL, UDL and LDL temporarily store data. In data write, the potential of the bit line BL is varied by the sense amplifier SA, for example, in accordance with the data which is stored by the data latch SDL. The other data latches UDL and LDL are used as a cache, for example, in executing a multi-level operation in which each memory cell transistor MT stores data of two bits or more, or in executing an arithmetic process on read data or write data.

In each sense amplifier unit SAU, the sense amplifier SA, and data latches SDL, UDL and LDL are mutually connected by a bus LBUS. In the example of FIG. 3, the bus LBUS is disposed in a manner to cross two sense amplifier units SAU, which neighbor in a bit line BL direction, in a direction along the bit line BL.

The sense amplifier units SAU and the data latches XDL are connected by a bus DBUS. In the example of FIG. 3, sixteen sense amplifier units SAU, which are arranged in one column, and sixteen data latches XDL, which are arranged in one column, share one bus DBUS. This enables data transmission and reception between a sense amplifier unit SAUx (x: an integer of 0 to 15) and a data latch XDLx corresponding to the sense amplifier unit SAUx. To the bus DEUS, a voltage controller 24 is connected.

The voltage controller 24 includes a precharge circuit (precharger) 20 and a discharge circuit (discharger) 22.

The precharger 20 precharges the bus DBUS. The precharger 20 includes a transistor 21. The transistor 21 is, for example, a p-channel MOS transistor. One end of the current path of the transistor 21 is connected to the bus DBUS, the other end of the current path is connected to a node of a power supply voltage VDD, and the gate of the transistor 21 receives a signal DPCn.

The discharger 22 discharges the bus DBUS. The discharger 22 includes a transistor 23. The transistor 23 is, for example, an n-channel MOS transistor. One end of the current path of the transistor 23 is connected to the bus DBUS, the other end of the current path is connected to a node of a ground voltage VSS, and the gate of the transistor 23 receives a signal DDS.

The voltage value of the bus DBUS varies between a voltage value of "H" level, which is indicative of a charged state, and a voltage value of "L" level, which is indicative of a discharged state. The voltage value of the bus DBUS varies, for example, in accordance with precharge by the precharger 20, and discharge by the discharger 22. In addition, the voltage value of the bus DBUS varies in accordance with data transfer between the sense amplifier unit SAU and data latch XDL.

With the sense amplifier units SAU, data latches XDL, voltage controller 24 and bus DBUS, data is written, read out, or subjected to an arithmetic process. Specifically, the set of sense amplifier SA, data latches SDL, UDL, LDL and XDL, precharger 20, discharger 22 and bus DBUS is configured as a data processing circuit 2 which processes data.

[Dummy Circuit]

Referring to FIG. 4, a description is given of a more detailed configuration example of the dummy units DMU and dummy latches XDLd. FIG. 4 illustrates a view in which the dummy units DMU and dummy latches XDLd are arranged in one column.

As illustrated in FIG. 4, each of the dummy units DMU includes, for example, three dummy latches SDLd, UDLd and LDLd. In the dummy unit DMU, no structure corresponding to the sense amplifier SA of the sense amplifier unit SAU is provided. Alternatively, the dummy unit DMU may include a structure which is not involved in the variation in potential of the bit line BL, that is, a dummy structure like a sense amplifier, which is not connected to the bit line BL. Accordingly, the dummy latches SDLd, UDLd, and LDLd are also a dummy structure which does not include a function as the ordinary data latches SDL, UDL, and LDL. The dummy latches SDLd, UDLd, and LDLd temporarily store pseudo-data, and not real data such as so-called user data.

In each dummy unit DMU, the dummy latches SDLd, UDLd and LDLd are mutually connected by a bus LBUSd. In the example of FIG. 4, the bus LBUSd is disposed in a manner to cross two dummy units DMU in the direction along the sense amplifier unit SAU column, the two dummy units DMU neighboring in the direction along the sense amplifier unit SAU column.

The dummy units DMU and the dummy latches XDLd are connected by a bus DBUSd. In the example of FIG. 4, sixteen dummy units DMU, which are arranged in one column, and sixteen dummy latches XDLd, which are arranged in one column, share one bus DBUSd. This enables data transmission and reception between a dummy unit DMUy (y: an integer of 0~15) and a dummy latch XDLdy corresponding to the dummy unit DMUy. However, the data which is handled by the dummy latch XDLd is not real data, but pseudo-data. To the bus DBUSd, a voltage controller 24$d$ and a charge and discharge detection circuit (detector) 30 are connected. The charge and discharge detector 30 is included in the controller 18. Specifically, at least a part of the controller 18 functions as the charge and discharge detector 30.

The voltage controller 24$d$ includes a precharger 20$d$ and a discharger 22$d$.

The precharger 20$d$ precharges the bus DBUSd. The precharger 20$d$ includes a transistor 21$d$. The transistor 21$d$ is, for example, a p-channel MOS transistor. One end of the current path of the transistor 21$d$ is connected to the bus DBUSd, the other end of the current path is connected to a node of a power supply voltage VDD, and the gate of the transistor 21$d$ receives a signal dDPCn. In this manner, the transistor 21$d$ of the precharger 20$d$ is controlled by the signal dDPCn, which is different from the signal by which the transistor 21 of the precharger 20 in the data processing circuit 2 is controlled.

The discharger 22$d$ discharges the bus DBUSd. The discharger 22$d$ includes a transistor 23$d$. The transistor 23$d$ is, for example, an n-channel MOS transistor. One end of the current path of the transistor 23$d$ is connected to the bus DBUSd, the other end of the current path is connected to a node of a ground voltage VSS, and the gate of the transistor 23$d$ receives a signal dDDS. In this manner, the transistor 23$d$ of the discharger 22$d$ is controlled by the signal dDDS, which is different from the signal by which the transistor 23 of the discharger 22 in the data processing circuit 2 is controlled.

The voltage value of the bus DBUSd varies between a voltage value of "H" level, which is indicative of a charged state, and a voltage value of "L" level, which is indicative of a discharged state. The voltage value of the bus DBUSd varies, for example, in accordance with precharge by the precharger 20$d$, and discharge by the discharger 22$d$. In addition, the voltage value of the bus DBUSd varies in accordance with data transfer between the dummy unit DMU and dummy latch XDLd.

The charge and discharge detector 30 detects the voltage value of the bus DBUSd, and sends the detection result to the core driver 14. The core driver 14 sends to the above-described data processing circuit 2 signals DPCn, LTL and XTL based on the detection result of the charge and discharge detector 30. In accordance with the states of these signals DPCn, LTL and XTL, the timings of precharge, discharge and of the bus DBUS and data transfer in the data processing circuit 2 are controlled.

With the dummy units DMU, dummy latches XDLd, voltage controller 24d and bus DBUSd, pseudo-data is temporarily stored, or is transferred between the dummy latches SDLd, UDLd, LDLd and XDLd. In this manner, the dummy latches SDLd, UDLd, LDLd and XDLd, precharger 20d, discharger 22d and bus DBUSd are configured as a dummy circuit 2d including a configuration corresponding to the data processing circuit 2. The charge and discharge detector 30 may be included in the dummy circuit 2d. For example, one dummy circuit 2d is provided for a plurality of data processing circuits 2.

As described above, the dummy circuit 2d is disposed, for example, near the data processing circuit 2. The components included in the dummy circuit 2d, such as the dummy latches SDLd, UDLd, LDLd and XDLd, voltage controller 24d and bus DBUSd, include substantially the same configurations as the corresponding components in the data processing circuit 2, such as the data latches SDL, UDL, LDL and XDL, voltage controller 24 and bus DBUS, and these components are formed, for example, in the same process steps.

The operations of the dummy circuit 2d, such as precharge, discharge and data transfer, are executed, for example, in interlock with the similar operations of the data processing circuit 2. In these operations, the charge and discharge detector 30 detects the voltage value of the bus DBUSd, and feeds the detection result back to the data processing circuit 2.

[Charge and Discharge Detector]

Figure 5:
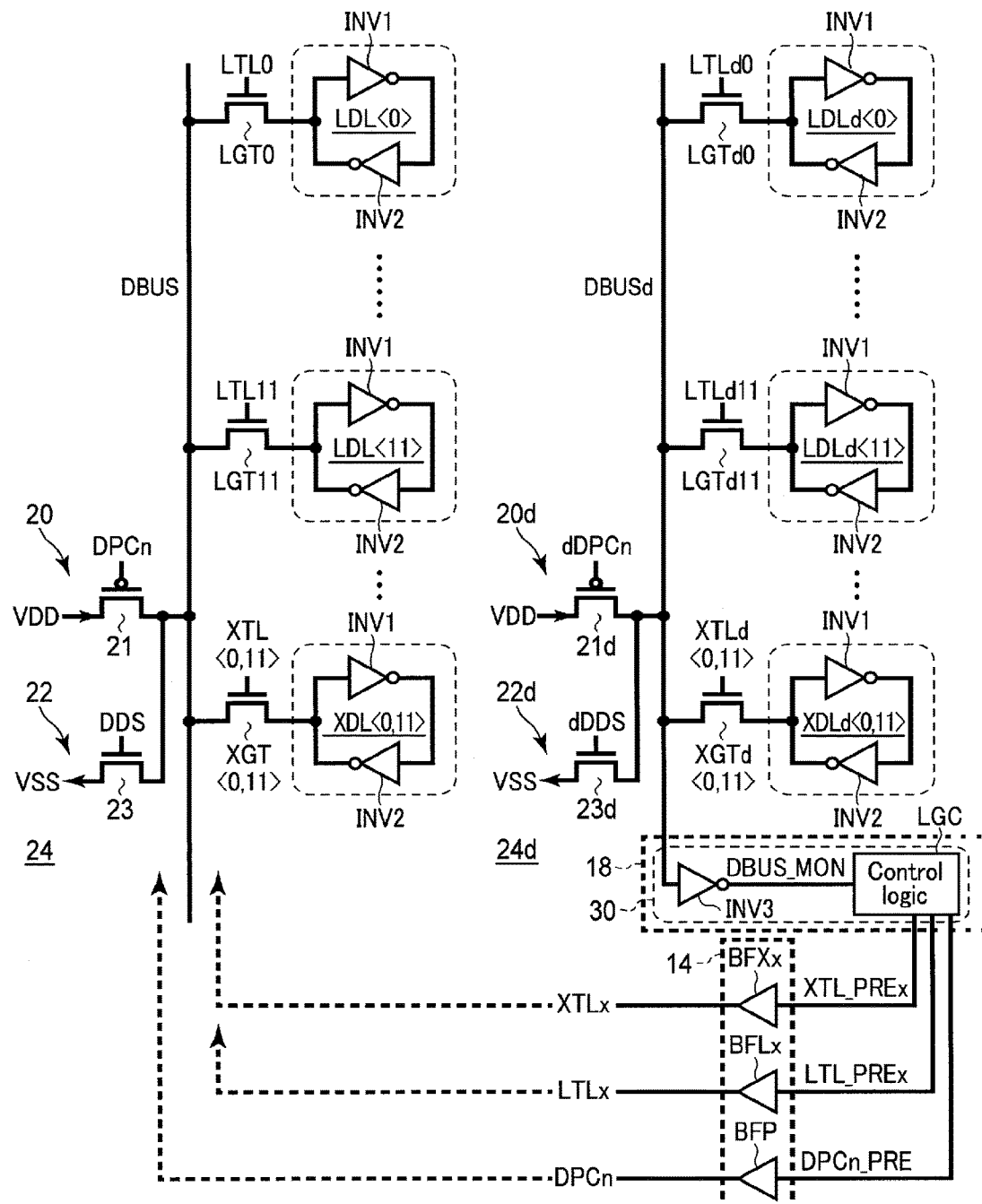
FIG. 5 illustrates a detailed example of a charge and discharge detector which the semiconductor storage device according to the embodiment includes.

Referring to FIG. 5, a more detailed configuration example of the charge and discharge detector 30 is described. FIG. 5 illustrates a detailed example of the charge and discharge detector 30 together with peripheral circuits thereof.

In FIG. 5, data latches LDL0, LDL11, XDL0 and XDL11 are illustrated as representatives of data latches SDL, UDL, LDL and XDL. However, the data latches XDL0 and XDL11 are depicted as one data latch.

The data latch LDL0 belongs to the sense amplifier unit SAU0. The data latch LDL11 belongs to the sense amplifier unit SAU 11. The data latch XDL0 executes data input and output to and from the data latch LDL0. The data latch XDL11 executes data input and output to and from the data latch LDL11.

Each of the data latches LDL0, LDL11, XDL0 and XDL11 includes a configuration in which, for example, two inverters INV1 and INV2 are combined. An input of the inverter INV1 is connected to an output of the inverter INV2. An output of the inverter INV1 is connected to an input of the inverter INV2. In addition, the input of the inverter INV1 and the output of the inverter INV2 are connected to the bus DBUS. When data is stored in one of the data latches LDL0, LDL11, XDL0 and XDL11, this data is stored as a potential at a node between the input of the inverter INV1 and the output of the inverter INV2.

The data latch LDL0 is connected to the bus DBUS via a transistor LGT0. The gate of the transistor LGT0 receives a signal LTL0. The data latch LDL11 is connected to the bus DBUS via a transistor LGT11. The gate of the transistor LGT11 receives a signal LTL11. The data latch XDL0 is connected to the bus DBUS via a transistor XGT0. The gate of the transistor XGT0 receives a signal XTL0. The data latch XDL11 is connected to the bus DBUS via a transistor XGT11. The gate of the transistor XGT11 receives a signal XTL11. Each of the transistors LGT0, LGT11, XGT0 and XGT11 is, for example, an n-channel MOS transistor.

These transistors LGT0, LGT11, XGT0 and XGT11 function as gates for data transfer (data transfer transistors). When the transistors of data latches of a transfer source and a transfer destination are turned on, data is transferred via the bus DBUS. In this manner, each data latch is selectively connected to the bus DBUS by turn-on and turn-off of the data transfer transistor which the data latch includes.

In FIG. 5, dummy latches LDLd0, LDLd11, XDLd0 and XDLd11 are also illustrated as representatives of dummy latches SDLd, UDLd, LDLd and XDLd. However, the dummy latches XDLd0 and XDLd11 are depicted as one data latch.

The dummy latch LDLd0 belongs to the dummy unit DMU0. The dummy latch LDLd11 belongs to the dummy unit DMU11. The dummy latch XDLd0 executes data input/output for the dummy latch LDLd0. The dummy latch XDLd11 executes data input/output for the dummy latch LDLd11.

Each of the dummy latches LDLd0, LDLd11, XDLd0 and XDLd11 includes a configuration in which, for example, two inverters INV1 and INV2 are combined.

The dummy latch LDLd0 is connected to the bus DBUSd via a transistor LGTd0. The gate of the transistor LGTd0 receives a signal LTLd0. The dummy latch LDLd11 is connected to the bus DBUS via a transistor LGTd11. The gate of the transistor LGTd11 receives a signal LTLd11. The dummy latch XDLd0 is connected to the bus DBUSd via a transistor XGTd0. The gate of the transistor XGTd0 receives a signal XTLd0. The dummy latch XDLd11 is connected to the bus DBUSd via a transistor XGTd11. The gate of the transistor XGTd11 receives a signal XDLd11. In this manner, the transistors LGTd0, LGTd11, XGTd0 and XGTd11 are controlled by the signals LTLd0, LTLd11, XTLd0 and XTLd11, which are different from the signals by which the transistors LGT0, LGT11, XGT0 and XGT11 of the data processing circuit 2 are controlled. Each of the transistors LGTd0, LGTd11, XGTd0 and XGTd11 is, for example, an n-channel MOS transistor.

These transistors LGTd0, LGTd11, XGTd0 and XGTd11 function as gates for data transfer (data transfer transistors). Each dummy latch is selectively connected to the bus DBUSd by turn-on and turn-off of the data transfer transistor which the dummy latch includes.

All of the data latches SDL, UDL, LDL and XDL and dummy latches SDLd, UDLd, LDLd and XDLd, including those not illustrated in FIG. 5, have the same configurations as described above.

The charge and discharge detector 30 includes an inverter INV3 and a logic circuit LGC. The charge and discharge detector 30 is included, for example, in the controller 18 although it is not always necessary that the inverter INV3 be included in the controller 18. For example, the inverter INV3 may be provided anywhere between the controller 18 and page buffer 12.

Signals from the charge and discharge detector 30, which will be described below, are processed by the core driver 14, and are distributed to the sense amplifier module 11 and page buffer 12. As components for executing such functions, the core driver 14 includes buffers BFP, BFLx and BFXx (x: an integer of 0~15). In this manner, the same number of buffers BFL, BFX, as the number of data latches LDL, XDL, that is, sixteen buffers BFL and sixteen buffers BFX, are prepared in the example of the present embodiment. Incidentally, as regards the data latches SDL and UDL not illustrated in FIG.

5, too, the same number of corresponding buffers as the number of these data laches are prepared.

An input of the inverter INV3 is connected to the bus DBUSd. Based on the voltage value of the bus DBUSd, the inverter INV3 outputs a signal DBUS_MON to the logic circuit LGC. Based on the signal DBUS_MON, the logic circuit LGC outputs signals DPCn_PRE, LTL_PREx and XTL_PREx to the buffers BFP, BFLx and BFXx. The logic circuit LGC is a circuit which generates and outputs DPCn_PRE, LTL_PREx and XTL_PREx of certain states ("L" level or "H" level) in accordance with the state ("L" level or "H" level) of the signal DBUS_MON.

The signal DPCn_PRE is output to the buffer BFP. The buffer BFP amplifies the signal DPCn_PRE and generates a signal DPCn. The signal DPCn is output to the transistor 21 of the precharger 20. The signal DPCn_PRE, DPCn is in "L" level when the signal DBUS_MON is in "H" level, and turns on the transistor 21. The signal DPCn_PRE, DPCn is in "H" level when the signal DBUS_MON is in "L" level, and turns off the transistor 21.

The signal LTL_PREx is output to the corresponding buffer BFLx. The buffer BFLx amplifies the signal LTL_PREx and generates a signal LTLx. The signal LTLx is output to the transistor LGTx of the data latch LDLx of the operation target. The signal LTL_PREx and LTLx are in "H" level when the signal DBUS_MON is in "L" level, and turn on the transistor LGTx of the corresponding data latch LDLx. The signal LTL_PREx and LTLx are in "L" level when the signal DBUS_MON is in "H" level, and turn off the transistor LGTx of the corresponding data latch LDLx. As regards the data latches SDL, UDL, which are not illustrated in FIG. 5, signals corresponding to these signals LTL_PREx, LTLx are prepared.

The signal XTL_PREx is output to the corresponding buffer BFXx. The buffer BFXx amplifies the signal XTL_PREx and generates a signal XTLx. The signal XTLx is output to the transistor XGTx of the data latch XDLx of the operation target. The signal XTL_PREx and XTLx are in "H" level when the signal DBUS_MON is in "L" level, and turn on the transistor XGTx of the corresponding data latch XDLx. The signal XTL_PREx and XTLx are in "L" level when the signal DBUS_MON is in "H" level, and turn off the transistor XGTx of the corresponding data latch XDLx.

(3) Operation Example of Sense Amplifier Module and Page Buffer

[Operation Example of Data Transfer]

Figure 6:
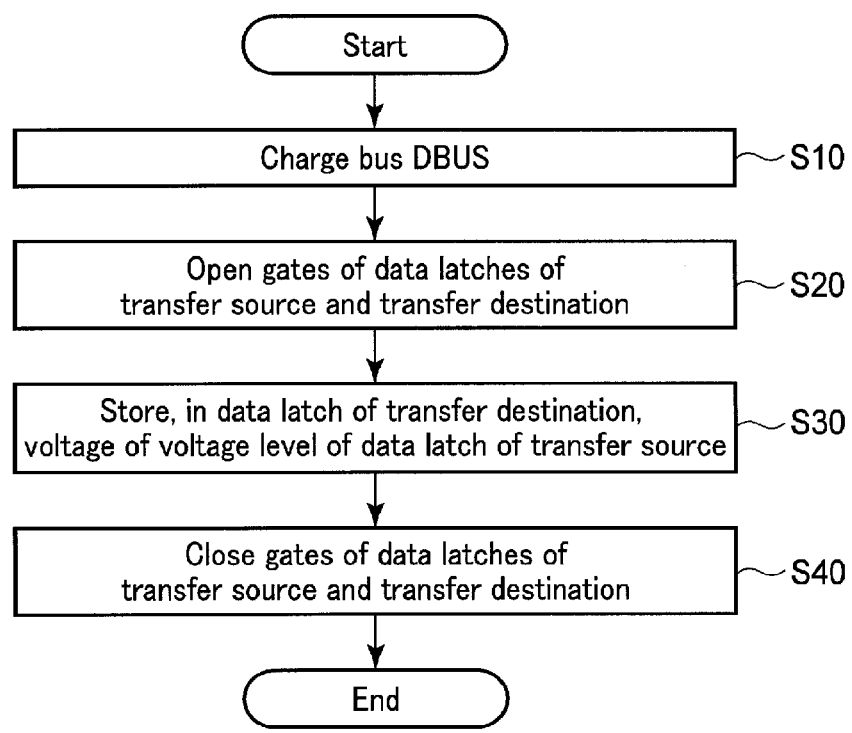
FIG. 6 illustrates an example of a flowchart of a data transfer method in the semiconductor storage device according to the embodiment.

Now, referring to FIG. 5 and also FIGS. 6 and 7, a description is given of an operation example of data transfer between the sense amplifier module 11 and page buffer 12.

Data transfer between the sense amplifier module 11 and page buffer 12 is executed, for example, between data latches LDLx and XDLx (x: an integer of 0~15). Data to be transferred is, for example, either "0" data or "1" data.

"0" data is stored in the data latch LDL and XDL, for example, as a voltage (potential) of "L" level. When "0" data is output to the bus DBUS of "H" level, the bus DBUS changes to "L" level. "1" data is stored in the data latch LDL and XDL, for example, as a voltage (potential) of "H" level. When "1" data is output to the bus DBUS of "H" level, the bus DBUS keeps "H" level.

In the present embodiment, in data transfer between the data latches LDLx and XDLx, data transfer is also executed between, for example, dummy latches LDLdy and XDLdy (y: an integer of 0~15, which is identical to or different from x). Between the dummy latches LDLdy and XDLdy, for example, "0" data is transferred, regardless of data that is transferred between the data latches LDLx and XDLx. Also in the dummy latches LDLd and XDLd, "0" data is stored, for example, as a voltage (potential) of "L" level. By the output of "0" data, the bus DBUSd of "H" level changes to "L" level. The operation between the dummy latches LDLdy and XDLdy is fed back to the operation between the data latches LDLx and XDLx by the charge and discharge detector 30.

Hereinafter, a description is given of an example of the case in which "0" data is transferred from the data latch LDLx to the data latch XDLx. In addition, it is assumed that the data latch XDLx stores "1" data at a time of the start of data transfer.

To begin with, referring to FIG. 6, an operation of data transfer between the data latches LDLx and XDLx is described. FIG. 6 illustrates an example of a flowchart of a data transfer method in the NAND flash memory 1.

As illustrated in FIG. 6, at a time of starting data transfer, the transistor 21 of the precharger 20 is first turned on, and the bus DBUS is precharged (step S10). Thereby, the bus DBUS goes to "H" level. Next, the gate of the data latch LDLx of the transfer source and the gate of the data latch XDLx of the transfer destination are opened. Specifically, the transistors LGTx and XGTx are turned on (step S20). Thereby, "0" data of the data latch LDLx is output to the bus DBUS, and the bus DBUS and data latch XDLx are discharged. Specifically, the bus DBUS changes to "L" level, and a voltage of "L" level is stored in the data latch XDLx (step S30). In the meantime, as regards the data latch XDLx, when "1" data was originally stored in the data latch XDLx, a voltage of "H" level is discharged, and when "0" data was originally stored, a voltage of "L" level is maintained. Thereafter, the gates of the gate latches LDLx and XDLx are closed (step S40).

By the above, the transfer of "0" data from the data latch LDLx to the data latch XDLx is completed.

Based on the voltage value of the bus DBUSd of the dummy circuit 2d, the charge and discharge detector 30 controls the timings (step S10) of the start and end of precharge of the bus DBUS. In addition, based on the voltage value of the bus DBUSd of the dummy circuit 2d, the charge and discharge detector 30 controls the timings (step S20, S30) of the start of discharge and the end of discharge of the bus DBUS and data latch XDLx.

This operation timings of the components of the data processing circuit 2, which are controlled by the charge and discharge detector 30 are illustrated in FIG. 7. FIG. 7 illustrates an example of a timing chart of each of signals in data transfer of the NAND flash memory 1.

As illustrated in FIG. 7, the controller 18 first supplies the signal dDPCn of "L" level to the gate of the transistor 21d of the precharger 20d to turn on the transistor 21d, and starts precharge of the bus DBUSd of the dummy circuit 2d. The controller keeps the signal dDPCn at "L" level for a period over which the bus DBUSd should be precharged. The charge and discharge detector 30 starts detection of the voltage value of the bus DBUSd.

At the time of the start of precharge, the bus DBUSd is, for example, in "L" level. Accordingly, a signal DBUS_MON of "H" level is input to the logic circuit LGC of the charge and discharge detector 30. The logic circuit LGC outputs a signal DPCn_PRE of "L" level and a signal DPCn is produced from the signal DPCn_PRE while the logic circuit LGC is receiving the signal dDPCn of "L" level and the signal DBUS_MON of "H" level. The signal DPCn of "L" level is input to the gate of the transistor 21 of the precharger 20. Thereby, the transistor 21 is turned on, and the precharge of the bus DBUS is started (time instant t1).

When the bus DBUSd goes to "H" level by the precharge (time instant t2), a signal DBUS_MON of "L" level is input to the logic circuit LGC. With the transition of the signal DBUS_MON to "L" level, the logic circuit LGC outputs a signal DPCn_PRE of "H" level, and a signal DPCn is produced from the signal DPCn_PRE. By the signal DPCn of "H" level, the transistor 21 is turned off with a little delay from time instant t2, and the precharge of the bus DBUS is completed (time instant t3). The signal dDPCn is made back "H" level based on the signal DBUS_MON having transitioned to "L" level.

In addition, when the bus DBUSd changes to "H" level and a signal DBUS_MON of "L" level is input, the logic circuit LGC outputs signals LTL_PREx and XTL_PREx of "H" level, and signals LTLx and XTLx are produced from these signals LTL_PREx and XTL_PREx. The signal LTLx of "H" level is input to the gate of the transistor LGTx of the data latch LDLx of the transfer source. The signal XTLx of "H" level is input to the gate of the transistor XGTx of the data latch XDLx of the transfer destination.

Thereby, the transistor LGTx is turned on, and discharge of the bus DBUS is started by "0" data which was output from the data latch LDLx to the bus DBUS (time instant t4). In addition, the transistor XGTx is turned on, and, with the discharge of the bus DBUS, discharge of the voltage stored in the data latch XDLx is started. The voltage stored in the data latch XDLx properly lowers after the voltage of the bus DBUS sufficiently lowered (time instant t5). Since the capacitance of the data latch XDLx is much smaller than the capacitance of the bus DBUS, the data latch XDLx changes to "L" level earlier than the bus DBUS.

On the other hand, at the timing of the start of discharge of the bus DBUS and data latch XDLx, the controller 18 starts discharge of the bus DBUSd and dummy latch XDLdy (time instant t4). Specifically, the controller 18 turns on the transistors LGTdy and XGTdy of the dummy latches LDLdy and XDLdy, and causes "0" data, which is stored in the dummy latch LDLdy, to be output (not illustrated). To this end, the controller 18 keeps the signals LTLd0 and XTLd at "H" level while the controller 18 is receiving the signal dDPCn of "H" level and the signal DBUS_MON of "L" level.

By the above-described discharge, when the bus DBUSd changes to "L" level (time instant t6), a signal DBUS_MON of "H" level is input to the logic circuit LGC. The logic circuit LGC outputs signals LTL_PREx and XTL_PREx of "L" level, and signals LTLx and XTLx are produced from these signals LTL_PREx and XTL_PREx. Thereby, the transistors LGTx and XGTx are turned off, with a little delay from time instant t6, and the data transfer is completed (time instant t7).

Incidentally, the transfer of "0" data from the data latch XDLx to the data latch LDLx is executed, basically, by the same flow as in FIGS. 6 and 7, with only the transfer source and transfer destination being interchanged.

In the transfer of "1" data between the data latches LDLx and XDLx, in step S30 in FIG. 6, data transfer is executed, with the bus DBUS being kept in "H" level, without the bus DBUS and the data latch *DLx (*=L, or X) of the transfer destination being discharged. In this case, too, as described above, "0" data is transferred in the dummy circuit 2d. Thus, the charge and discharge detector 30 terminates the data transfer in the data processing circuit 2, based on the fact that the bus DBUSd and the dummy latch *DLdy of the transfer destination were discharged and the bus DBUSd changed to "L" level.

The above description also applies to the data transfer between the data latches SDLx and XDLx and between the dummy latches SDLdy and XDLdy, and the data transfer between the data latches UDLx and XDLx and between the dummy latches UDLdy and XDLdy.

[Example of "0" Data Set Operation to Dummy Latch]

As described above, in data transfer between the data latches LDLx and XDLx, for example, "0" data is transferred from the dummy latch LDLd to the dummy latch XDLd. Accordingly, "0" data has to be stored in the dummy latch LDLd of the transfer source, prior to the data transfer between the data latches LDLx and XDLx. Thus, "0" data is set in advance in the dummy latch LDLd.

Hereinafter, referring to FIGS. 8 and 9, a description is given of an example of a set operation of "0" data to the dummy latch LDLd.

Figure 8:
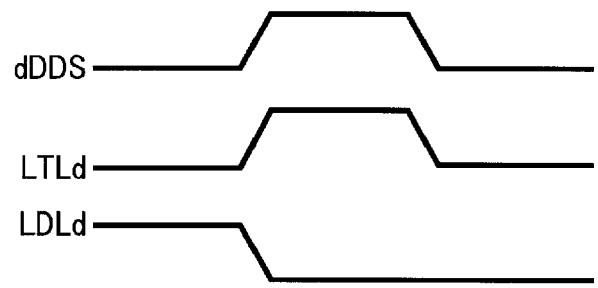
FIG. 8 illustrates an example of a timing chart of each of signals in "0" data set in a dummy latch of the semiconductor storage device according to the embodiment.

FIG. 8 illustrates an example of a timing chart of each of signals in "0" data set in the dummy latch LDLd of the NAND flash memory 1. FIG. 9 schematically illustrates a state of the dummy latch LDLd and XDLd in "0" data set in the dummy latch LDLd of the NAND flash memory 1.

Figure 9:
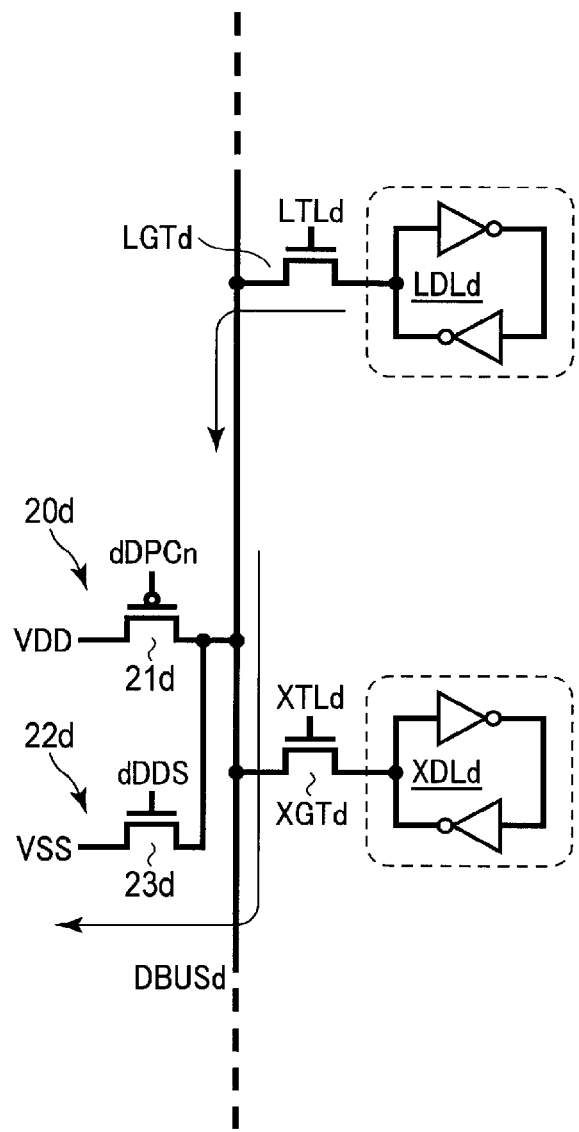
FIG. 9 schematically illustrates a state of the dummy latch in "0" data set in the dummy latch of the semiconductor storage device according to the embodiment.

As illustrated in FIGS. 8 and 9, the controller 18 outputs a signal dDDS of "H" level to the gate of the transistor 23d of the discharger 22d, and turns on the transistor 23d. In addition, the controller 18 outputs a signal LDLd of "H" level to the gate of the transistor LGTd of the dummy latch LDLd, and turns on the transistor LGTd.

In this manner, by the transistor 23d being turned on, the bus DBUSd is discharged. In accordance with this, the dummy latch LDLd is also discharged. Thus, "0" data is set in the dummy latch LDLd.

It should suffice if the set operation of "0" data to the dummy latch LDLd is, at the least, executed prior to the start of data transfer between the data latches LDL and XDL. Thus, the controller 18 executes the "0" data set operation in advance during a period in which data transfer is not executed, such as when the NAND flash memory 1 is in an idle state. The transistors 23d and LGTd are controlled by the signals dDDS and LTLd, which are different from the signals by which the corresponding transistors 23 and LGT in the data processing circuit 2 are controlled. Therefore, the controller 18 can execute the above-described "0" data set operation, separately from the operation of the data processing circuit 2.

In the meantime, although the above description has been given of the example in which the dummy latch LDLd is the transfer source, the embodiment is not limited to this example. For example, in the case in which the dummy latch XDLd is the transfer source, the controller 18 sets "0" data in the dummy latch XDLd by the same procedure as described above.

(4) Advantageous Effects of the Present Embodiment

According to the present embodiment, one or more of advantageous effects, which will be described below, can be obtained based on the following configuration (A) to configuration (G).

(A) According to the present embodiment, the NAND flash memory 1 includes the data processing circuit 2 and dummy circuit 2d (and charge and discharge detector 30).

(B) According to the present embodiment, for example, when data transfer is executed between the data latches LDL and XDL, the precharger 20 of voltage controller 24 and the precharger 20d of voltage controller 24d start control such that the bus DBUS and DBUSd changes to "H" level.

(C) According to the present embodiment, in data transfer, when the charge and discharge detector 30 detects that the bus DBUSd has changed to "H" level, the precharger 20 of the voltage controller 24 stops control. To be more specific, the charge and discharge detector 30 transmits, as needed, a signal DPCn of "L" level or "H" level to the precharger 20 via the core driver 14. Based on the signal DPCn, the precharger 20 executes control to set the bus DBUS at "H" level, or stops the control.

By the above configurations (A), (B) and (C), the time for which precharge of the bus DBUS is executed can be optimized.

This point is described with reference to FIGS. 10 and 11. FIG. 10 illustrates an example of a timing chart of each of signals at a time of the start of data transfer of a NAND flash memory according to a comparative example. FIG. 10 is based on comparison with a part of FIG. 7 which illustrates the present embodiment. FIG. 11 illustrates a part of FIG. 7.

As illustrated in FIG. 10, for example, the time for executing precharge is fixed in advance because the NAND flash memory of the comparative example does not include, for example, the dummy circuit 2d and charge and discharge detector 30. On the other hand, a variance may occur in line width of bus DBUScomp and characteristics of data transfer transistors of data latches LDLcomp and XDLcomp among NAND flash memories. Consequently, a variance may occur in time that is actually needed for precharge of the bus DBUScomp among NAND flash memories. In one NAND flash memory, too, a variance may occur in output voltage of the precharger due to the state of a power supply during operation, and a variance may occur in actual precharge time.

Thus, for example, as illustrated in FIG. 10, it is necessary to set the time of execution of precharge in accordance with a longest time of the variance in actual precharge time among the NAND flash memories and within the NAND flash memory. However, in many cases, the actual precharge time is shorter than the set time, and a useless wait time occurs. This wait time corresponds to, for example, a period of time instant t2 to t3 in FIG. 10. FIG. 10 illustrates a state in which the period of time instant t2 to t3 is set to be longer.

In the present embodiment, in data transfer, the controller 18 interlocks the data processing circuit 2 and the dummy circuit 2d with each other. The data processing circuit 2 and dummy circuit 2d are disposed near each other and have substantially the same configuration. Thus, the difference in line width of buses DBUS and DBUSd and the difference in characteristics of various transistors included in the data processing circuit 2 and dummy circuit 2d are small. The influence from the power supply, etc. is also substantially equal between the data processing circuit 2 and dummy circuit 2d.

From the above, the voltage value of the bus DBUSd corresponds to the voltage value of the bus DBUS. Specifically, for example, when the bus DBUSd has changed to "H" level, it can be determined that the bus DBUS has also changed to "H" level. To be more specific, based on the voltage value of the bus DBUSd, the time of execution of precharge of the bus DBUS can be adjusted. Accordingly, as illustrated in FIG. 11, by only providing a small margin (time instant t2 to t3) to the operation time of the transistor 21, the precharge execution time of the bus DBUS can be optimized to be a relatively close time to an actual necessary precharge time. Therefore, the useless time in the precharge of the bus DBUS can be reduced.

(D) According to the present embodiment, for example, when data transfer is executed between the data latches LDL and XDL, data is transferred between the dummy latches LDLd and XDLd in accordance with the change of the bus DBUSd to "L" level.

(E) According to the present embodiment, in the above data transfer, when the charge and discharge detector 30 has detected that the bus DBUSd changed to "L" level, the data transfer between the data latches LDL and XDL is completed. To be more specific, the charge and discharge detector 30 transmits, as needed, the signals LTL and XTL of "L" level or "H" level to the transistors LGT and XGT of the data latches LDL and XDL via the core driver 14. The transistors LGT and XGT are turned on or turned off in accordance with the signals LTL and XTL.

By the above configurations (A), (D) and (E), the timing of the end of data transfer between the data latches LDL and XDL can be optimized.

This point is described with reference to FIGS. 12 and 13. FIG. 12 illustrates an example of a timing chart of each of signals at a time of the end of data transfer of the NAND flash memory of the comparative example. FIG. 12 is based on comparison with a part of FIG. 7, which illustrates the present embodiment. FIG. 13 illustrate a part of FIG. 7. Hereinafter, to begin with, the problem of the NAND flash memory of the comparative example is described, and then, based on this, a description is given of FIGS. 12 and 13.

In the comparative example, a variance may occur in timing of the end of data transfer, due to the above-described differences in the structures, characteristics and conditions at times of operations of the individual NAND flash memories. Specifically, a variance may occur in the necessary time until data is stored in the data latch *DLcomp (*=L, or X) of the transfer destination, after the end of precharge of the bus DBUScomp.

Thus, for example, as illustrated in FIG. 12, it is necessary to preset the time for which the transistor LGTcomp of data latch LDLcomp of the transfer source and the transistor XGTcomp of data latch XDLcomp of the transfer destination are ON, in accordance with the longest time of the variation of the time up to storage of data. However, in many cases, the actual time until storage of data is shorter than the set ON time of the transistors LGTcomp and XGTcomp, and a useless wait time occurs. This wait time corresponds to, for example, a period of time instant t6 to t7 in FIG. 12. FIG. 12 illustrates a state in which the period of time instant t6 to t7 is set to be longer.

In the present embodiment, the controller 18 executes data transfer between the dummy latches LDLd and XDLd. The charge and discharge detector 30 adjusts the time for which the transistors LGT and XGT are ON, based on the voltage value of the bus DBUSd at this time. Thus, as illustrated in FIG. 13, by only providing a small margin (time instant t6 to t7), the time for which the transistors LGT and XGT are ON can be optimized to be a relatively close time to an actual necessary time up to storage of data. Therefore, the useless time in the storage of data can be reduced.

(F) According to the present embodiment, when data is transferred between the data latches LDL and XDL, "0" data or "1" data is transferred. When data is transferred between the dummy latches LDLd and XDLd, "0" data is transferred.

By the above configuration (F), the charge and discharge detector 30 can terminate the data transfer between the data latches LDL and XDL, with a sufficient allowance being provided.

In the present embodiment, "0" data is transferred between the dummy latches LDLd and XDLd. "0" data is transferred by the discharge of the bus DBUSd. Thus, compared to the transfer of "1" data, in which the bus DBUSd is kept at "H" level, the transfer of "0" data, which requires discharge of the bus DBUSd, takes a longer time.

Thus, no matter which data is transferred between the data latches LDL and XDL, it can be determined that the data transfer between the data latches LDL and XDL was terminated, when the data transfer of "0" data between the dummy latches LDLd and XDLd was terminated. In this manner, since the end of data transfer between the data latches LDL and XDL is determined with reference to the data transfer which requires a longer time, a margin can be provided to the timing of the end of the data transfer.

By the above configuration (F), the charge and discharge detector 30 can determine whether the data transfer between the dummy latches LDLd and XDLd has been terminated, based on whether the bus DBUSd has changed to "L" level. Therefore, the charge and discharge detector 30 can easily determine the timing of the end of data transfer between the data latches LDL and XDL.

(G) According to the present embodiment, for example, when data is transferred between the data latches LDL and XDL, the discharger 22$d$ of the voltage controller 24$d$ changes the bus DBUSd to "L" level, and "0" data is set in the dummy latch LDLd. Thereafter, "0" data is transferred from the dummy latch LDLd to the dummy latch XDLd.

By the above configuration (G), it is possible to realize the above-described configuration in which "0" data is transferred between the dummy latches LDLd and XDLd, when data is transferred between the data latches LDL and XDL.

(5) Modification According to the Embodiment

A modification according to the present embodiment is described with reference to FIG. 14 to FIG. 16.

[Operation Example of Data Transfer]

When data transfer between the dummy latches LDLdy and XDLdy is interlocked with data transfer between the data latches LDLx and XDLx, some methods are possible. They are a case in which the dummy latches LDLdy and XDLdy are selected such that x=y, and a case in which the dummy latches LDLdy and XDLdy are selected such that x≠y.

If a description is given with reference to the example of FIG. 5, the case of x=y is such a case that, in data transfer between the data latches LDL0 and XDL0, data transfer is executed between the dummy latches LDLdy and XDLdy, and, in data transfer between the data latches LDL11 and XDL11, data transfer is executed between the dummy latches LDLd11 and XDLd11. Such selection of the dummy latches LDLdy and XDLdy is executed, for example, by the controller 18. The positions of the dummy latches LDLd0 and XDLd0 on the bus DBUSd have a relation of correspondency to the positions of the data latches LDL0 and XDL0 on the bus DBUS. Specifically, the distance of the bus DBUSd between the dummy latches LDLd0 and XDLd0 is substantially equal to the distance of the bus DBUS between the data latches LDL0 and XDL0. The same applies to the data latches LDL11 and XDL11 and the dummy latches LDLd11 and XDLd11. In this manner, the case of x=y is the case in which the controller 18 interlocks the data latches LDLx and XDLx and the dummy latches LDLdy and XDLdy, which have mutually corresponding positions on the buses DBUS and DBUSd.

FIG. 14 illustrates various signals in the case in which data transfer between the data latches LDL11 and XDL11 is executed subsequently to data transfer between the data latches LDL0 and XDL0.

As illustrated in FIG. 14, in data transfer (time instant t11 to t12) between the data latches LDL0 and XDL0, the signals LTL0 and XTL0 to the transistors LGT0 and XGT0 are set at "H" level. In data transfer (time instant t13 to t14) between the data latches LDL11 and XDL11, the signals LTL11 and XTL11 to the transistors LGT11 and XGT11 are set at "H" level.

FIG. 15 illustrates various signals in the case in which, in the operation of FIG. 14, the controller 18 interlocks the dummy latches LDLdy and XDLdy in the case of x=y.

As illustrated in FIG. 15, the controller 18 executes such control that data transfer is executed between the dummy latches LDLd0 and XDLd0 in data transfer between the data latches LDL0 and XDL0 (time instant t11 to t12). Specifically, the controller 18 sets the signals LTLd0 and XTLd0 to the transistors LGTd0 and XGTd0 at "H" level. The controller 18 executes such control that data transfer is executed between the dummy latches LDLd11 and XTLd11 in data transfer between the data latches LDL11 and XDL11 (time instant t13 to t14). Specifically, the controller 18 sets the signals LTLd11 and XTLd11 to the transistors LGTd11 and XGTd11 at "H" level.

On the other hand, the case of x≠y is such a case that data transfer is executed, for example, between the same dummy latches LDLdy and XDLdy (y=fixed), even in data transfer between the data latches LDL0 and XDL0, or in data transfer between the data latches LDL11 and XDL11. Specifically, for example, the controller 18 selects the dummy latches LDLdy and XDLd0 so that the distance of the bus DBUSd between the dummy latches LDLdy and XDLdy becomes longest. In this manner, the case of x≠y is the case in which the controller 18 interlocks the dummy latches LDLdy and XDLdy, between which the distance of the bus DBUSd is longest, with the data latches LDLx and XDLx.

FIG. 16 illustrates various signals in the case in which, in the above-described operation of FIG. 14, the controller 18 interlocks the dummy latches LDLdy and XDLdy in the case of x≠y.

As illustrated in FIG. 16, the controller 18 executes such control that data transfer is executed between the dummy latches LDLd0 and XDLd0, both in data transfer between the data latches LDL0 and XDL0 and in data transfer between the data latches LDL11 and XDL11 (time instant t11 to t12, and time instant t13 to t14). Specifically, the controller 18 sets the signals LTLd0 and XTLd0 to the transistors LGTd0 and XGTd0 at "H" level, both in data transfer between the data latches LDL0 and XDL0 and in data transfer between the data latches LDL11 and XDL11.

[Advantageous Effects of the Present Modification]

According to the present modification, one or more of advantageous effects, which will be described below, can be obtained in addition to the advantageous effects of the above-described embodiment.

(A) According to the present modification, when data transfer is executed between the data latches LDL0 and XDL0, data transfer is executed between the dummy latches LDLd0 and XDLd0. When data transfer is executed between the data latches LDL11 and XDL11, data transfer is executed between the dummy latches LDLd11 and XDLd11.

The necessary time for data transfer varies depending on the length of the distance of the bus DBUS between the data latches LDL and XDL, between which the data transfer is executed. For example, the longer the distance of the bus DBUS, the greater the capacitance of the bus DBUS over this length, and the longer the necessary time for data transfer.

In the present embodiment, the controller 18 interlocks the data latches LDLx and XDLx and the dummy latches LDLdy and XDLdy, which have mutually corresponding positions on the buses DBUS and DBUSd. Thereby, the actual data transfer time between the data latches LDLx and XDLx and the actual data transfer time between the dummy latches LDLdy and XDLdy tend to be more easily equalized. Therefore, the charge and discharge detector 30 can more exactly determine the timing of the end of data transfer between the data latches LDLx and XDLs.

(B) According to the present modification, when data transfer is executed between the data latches LDL0 and XDL0 and when data transfer is executed between the data latches LDL11 and XDL11, data transfer is executed between the dummy latches LDLd0 and XDLd0.

In this modification, the controller 18 interlocks the dummy latches LDLdy and XDLd0, between which the distance of the bus DBUSd is longest, with the data latches LDLx and XDLx. Thereby, even in any combination of the data latches LDLx and XDLx between which data transfer is executed, the actual data transfer time between the dummy latches LDLd0 and XDLd0 becomes equal to or longer than the actual data transfer time between the data latches LDLx and XDLx. Therefore, the charge and discharge detectort 30 can provide a sufficient allowance to the timing of the end of data transfer between the data latches LDL and XDL.

<Other Embodiments>

In the above-described embodiment and modification, the description has been given of the example in which the charge and discharge detector 30 controls both the timing of the end of precharge of the bus DBUS and the timing of the end of discharge of the bus DBUS and data latch XDLx. However, there is no restriction to this example. The charge and discharge detector 30 may control only either of them. In this case, too, if consideration is given to the data transfer as a whole, the total time can be optimized.

In the above-described embodiment and modification, the description has been given of the example in which the charge and discharge detector 30 includes the configuration as illustrated in FIG. 5. However, there is no restriction to this example. The charge and discharge detector may have any configuration as long as the detection result of the voltage value of the bus LBUSd can be fed back to the operations of the precharger 20 of the data processing circuit 2 and the data latches SDL, UDL, and LDL.

In the above-described embodiment and modification, the description has been given of the example in which the charge and discharge detector 30 is applied to the data transfer between the sense amplifier 11 and page buffer 12. However, there is no restriction to this example. The charge and discharge detector may be applied to, for example, data transfer within the sense amplifier unit SAU. Each sense amplifier unit SAU includes, for example, a precharger which executes precharge of the bus LBUS. The dummy unit DMU may also be provided with a precharger which executes precharge of the bus LBUSd. Thereby, the charge and discharge detector may control the precharge time of the bus LBUS, based on the voltage value of the bus LBUSd. In addition, the charge and discharge detector may control the timing of the end of data transfer between the data latches SDL, UDL, and LDL, based on the voltage value of the bus LBUSd.

In the above-described embodiment and modification, the description has been given of the example in which the NAND flash memory 1 is a planar NAND. However, there is no restriction to this example. The NAND flash memory may be a three-dimensional NAND in which memory cells are arranged in a three-dimensional fashion.

In the above-described embodiment and modification, the description has been given of the example in which the semiconductor storage device is the NAND flash memory 1. However, there is no restriction to this example. The semiconductor storage device may not be a flash memory, but may be, for example, some other DRAM (Dynamic Random Access Memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory cell;
a first latch selectively coupled to the memory cell;
a second latch;
a first bus coupled to the first and second latches;
a first charger which charges the first bus;
a second bus which transmits a signal of the same value both when first data is output and when second data is output from the first or second latch;
a third latch and a fourth latch which are coupled to the second bus;
a second charger which raises a voltage of the second bus from a first value to a second value; and
a controller whose input is coupled to the second bus and which controls the first charger to stop charging of the first bus based on the voltage of the second bus having reached the second value, the controller controlling data transfer between the first and second latches and stopping the data transfer based on the voltage of the second bus having decreased from the second value to a third value, the controller transferring a signal of a low level between the third and fourth latches during the data transfer between the first and second latches both when the first data is transferred and when the second data is transferred.

2. The device of claim 1, wherein
the controller starts the transfer of the data between the first and second latches based on the voltage of the second bus having reached the second value.

3. The device of claim 2, wherein
the controller starts the transfer of the signal of the low level between the third and fourth latches based on the voltage of the second bus having reached the second value.

4. The device of claim 3, wherein
the transfer of the data between the first and second latches and the transfer of the signal of the low level between the third and fourth latches are started substantially simultaneously.

5. The device of claim 1, wherein
the signal of the low level is latched at the third or fourth latch prior to the transfer of the data between the first and second latches.

6. The device of claim 5, wherein
the signal of the low level at the third or fourth latch is latched prior to the transfer of the data between the first and second latches in every transfer of data between the first and second latches.

7. The device of claim 1, wherein
the charging of the first bus and the raising of the voltage of the second bus to the second value are started substantially simultaneously.

8. The device of claim 1, wherein
the first latch is coupled to the first bus at a first position,
the second latch is coupled to the first bus at a second position,
the third latch is coupled to the second bus at a third position,
the fourth latch is coupled to the second bus at a fourth position, and
the distance between the first and second positions is substantially equal to the distance between the third and a fourth positions.

9. The device of claim 8, wherein
the device further comprises:
  a fifth latch coupled to the first bus at a fifth position;
  a sixth latch coupled to the first bus at a sixth position;
  a seventh latch coupled to the second bus at a seventh position; and
  an eighth latch coupled to the second bus at an eighth position,
the distance between the fifth and sixth positions is substantially equal to the distance between the seventh and eighth positions, and
during transfer of data between the fifth and sixth latches, the controller transfers between the seventh and eighth latches a signal of a low level both when third data is transferred and when fourth data is transferred.

10. The device of claim 1, wherein
the first latch is coupled to the first bus at a first position,
the second latch is coupled to the first bus at a second position,
the third latch is coupled to the second bus at a third position,
the fourth latch is coupled to the second bus at a fourth position, and
the distance between the first and second positions differs from the distance between the third and fourth positions.

11. The device of claim 1, wherein
the controller receives the voltage of the second bus as an input, and has an output coupled to the first charger.

12. The device of claim 1, wherein
the first latch is coupled to the first bus via a first transistor,
the second latch is coupled to the second bus via a second transistor, and
a gate of the first transistor and a gate of the second transistor are coupled to the controller.

13. The device of claim 1, wherein
the semiconductor memory device further comprises:
a sense amplifier which senses data of the memory cell and includes the first latch; and
a buffer which receives data from the sense amplifier, receives data from the sense amplifier, and includes the second latch.

14. The device of claim 1, wherein
the second bus, third latch, and fourth latch have substantially the same structures as structures of the first bus, the first latch, and the second latch, respectively.

* * * * *